US006952812B2

(12) United States Patent
Abadir et al.

(10) Patent No.: US 6,952,812 B2
(45) Date of Patent: Oct. 4, 2005

(54) DESIGN ANALYSIS TOOL FOR PATH EXTRACTION AND FALSE PATH IDENTIFICATION AND METHOD THEREOF

(75) Inventors: Magdy S. Abadir, Austin, TX (US); Jing Zeng, Austin, TX (US); Jayanta Bhadra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 584 days.

(21) Appl. No.: 09/781,492

(22) Filed: Feb. 13, 2001

(65) Prior Publication Data

US 2002/0112213 A1 Aug. 15, 2002

(51) Int. Cl.$^7$ .............................................. G06F 17/50
(52) U.S. Cl. .................................. 716/4; 716/5; 716/6
(58) Field of Search ..................................... 716/4, 5, 6

(56) References Cited

U.S. PATENT DOCUMENTS

| 5,648,909 A | | 7/1997 | Biro et al. .................. 364/488 |
| 5,659,486 A | | 8/1997 | Tamiya .................. 395/200.75 |
| 5,675,728 A | * | 10/1997 | Kunda et al. .................. 714/28 |
| 2002/0104065 A1 | * | 8/2002 | Tsukiyama et al. ............. 716/6 |

FOREIGN PATENT DOCUMENTS

EP        0697668 A1  *  2/1996   ........... G06F/17/50

OTHER PUBLICATIONS

Chang et al., VIPER: An Efficient Vigorously Sensitizable Path Extractor, Proceedings of the 30$^{th}$ International Design Automation Conference, pp. 112–117, Jul. 1993.*

Bhadra et al., A Quick and Inexpensive Method to Identify False Critical Paths Using ATPG Techniques: An Experiment with a PowerPC Microprocessor, Proceedings of the IEEE 2000 Custom Integrated Circuits Conference, pp. 71–74, May 2000.*

Zeng et al., Full Chip False Timing Path Identification, IEEE Workshop on Signal Processing Systems, pp. 703–711, Oct. 2000.*

Zeng et al., False Timing Path Identification Using ATPG Technique and Delay–based Information, Proceedings of the 39$^{th}$ Design Automation Conference, pp. 562–565, Jun. 2002.*

Sivaraman et al., Primitive Path Delay Faults: Identification and Their Use in Timing Analysis, IEEE Transactions on Computer–Aided Design of Integrated Circuits and Systems, pp. 1347–1362, Nov. 2000.*

Lin et al., Dynamical Identification of Critical Paths for Iterative Gate Sizing, IEEE/ACM International Conference on Computer–Aided Design, pp. 481–484, Nov. 1994.*

(Continued)

Primary Examiner—A. M. Thompson
(74) Attorney, Agent, or Firm—Robert L. King; Joanna G. Chiu (57) ABSTRACT

A design analysis tool performs path extraction translation and false path identification functions. The design analysis tool is utilized with a conventional automated test pattern generator and timing analysis tools. By checking for four specific criteria, a fast and efficient way to detect whether a circuit path is false or active is accomplished. A final value condition is checked and, if that test is met, a side value propagation condition is checked. Assuming both tests result in the path still being active, the test is terminated. If the side value propagation conditions are not satisfied, then an initial value condition and a slower path condition is checked. The checks are made to determine whether or not conditions exist in the path that makes the path false. The information may be obtained quickly from the timing analysis information and the result of the ATPG tool.

20 Claims, 4 Drawing Sheets

OTHER PUBLICATIONS

Zeng et al., Full Chip False Timing Path Identification: Applications to the PowerPC Microprocessors, 2001 Proceedings of Design, Automation and Test in Europe, pp. 514–518, Mar. 2001.*

Wolf et al., Intervals in Software Execution Cost Analysis, 13th International Symposium on System Synthesis, pp. 130–135, Sep. 2000.*

Raimi et al., Detecting False Timing Paths: Experiments on PowerPC microprocessors, Proceedings of the 36th ACM/IEEE Conference on Desing Automation, pp. 737–741, Jun. 1999.*

Ringe et al., "Path Verification Using Boolean Satisfiability," Design, Automation and Test in Europe Conference & Exhibition, 2 pgs. (2000).

Liu et al., "Transistor Level Synthesis for Static CMOS Combinational Circuits," Ninth Great Lakes Symposium on VLSI Proceedings, 4 pgs. (1999).

Raimi et al., "Detecting False Timing Paths: Experiments on PowerPC™ Microprocessors," 36th Design Automation Conference Proceedings, pp. 737–741 (1999).

Lee et al., "Critical Path Identifiction and Delay Tests of Dynamic Circuits," IEEE, pp. 421–430 (1999), ITC International Test Conference.

Sivaraman et al., "Timing Analysis Based on Primitive Path Delay Fault Identification," IEEE, pp. 182–189 (1997), International Conference on Computer Aided Design.

Ashar et al., "Functional Timing Analysis Using ATPG," IEEE Transactions on Computer–Aided Design of Integrated Circuits and Systems, vol. 14, No. 8, pp. 1025–1030 (Aug. 1995).

Alfred L. Crouch, *Design–for–Test for Digital IC's and Embedded Core Systems*, 1999 by Prentice Hall PTR, pp. 163–166.

* cited by examiner

DESIGN ANALYSIS TOOL FOR PATH EXTRACTION AND FALSE PATH IDENTIFICATION AND METHOD THEREOF

TECHNICAL FIELD OF THE INVENTION

This invention generally relates to design analysis tools and more particularly to design analysis tools for performing timing analysis and identification of critical paths in electronic circuits.

BACKGROUND OF THE INVENTION

Static timing analysis plays an important role in defining circuit performance for today's high-speed integrated circuits. Static timing analysis tools identify all the structural paths in the design and the calculated delay along each one of these paths. As commonly used, the term 'path' refers to two nodes in a circuit design coupled by one or more circuit devices. Typically, these paths start at a latch point and end at another latch point in the design. These paths are sorted according to their delay and the slowest (critical) paths in the design are identified. The designer then would have to work on these paths and try to optimize them to reduce the delay along these long paths in order to meet target performance frequency goals. Unfortunately, not all the paths identified by the static timing analysis tools are "true paths" because these paths cannot be activated in the design with various constraints. In other words, structural paths in a design that cannot be logically manipulated by signals or activated are called "false paths". This leads to a pessimistic estimation of the speed of the design and can also lead to wasted effort in trying to optimize or reduce the delay along these so called false paths. In industry today the problem of dealing with false paths is handled manually by the designers. Typically, false path analysis and any following corrective action just result in wasted engineering effort and underestimation of the performance of the design. Researchers have addressed this problem of identifying false paths and there are two broad classes of techniques based on how to evaluate the constraints associated with the various paths. One of these major techniques uses symbolic methods based on Binary Decision Diagrams (BDDs). These techniques suffer from memory and run time complexities. The other class of techniques models the problem as an instance of Boolean satisfiability (SAT) and use SAT solvers. Again, these techniques cannot handle the size and complexities of today's industrial circuits. Others have proposed modeling techniques to improve the timing analyzers themselves so that the timing analyzers avoid identifying false paths to start with. However, none of these techniques are commercially practical, as they require making extensive modifications to the design model and only work for circuits that are made out of simple gates and under the unit gate delay assumptions. A unit gate delay assumption is the assumption that each gate has associated with it an equal unit of delay. These techniques are generally not practical in commercial circuits. Previous research has indicated that for most circuits only a small percentage of the paths in the circuit are actually true paths or synthesizable paths. There are two reasons why paths are found to be false paths. One reason has to do with combinational constraints associated with the paths within the combinational logic surrounding the path. The second reason is a result of sequential constraints associated with the state values required to activate the paths. Sequential constraints may prevent certain paths from ever assuming state values that would enable such paths to be true paths. Known techniques used to analyze complex circuit designs for the detection of and correction of false paths are expensive, slow and sometimes inaccurate.

BRIEF DESCRIPTION OF THE DRAWINGS

Illustrated in FIG. 1, in block diagram form, is an exemplary path in a complex design.

Illustrated in FIG. 2, in partial logic diagram form, are examples of false paths.

Illustrated in FIG. 3 is a process flow for performing timing analysis and false path identification in conjunction with an automated test pattern generation tool.

Illustrated in FIG. 4, in block diagram form, is an example of path extraction and enumeration from a launch point to a capture point.

Illustrated in FIG. 5 is a flow chart of false path identification in accordance with one embodiment of the present invention.

Illustrated in FIG. 6, in partial logic diagram form, is an example of false path identification between a launch point and a capture point in accordance with the present invention.

Illustrated in FIG. 7, in logic diagram form, is an example of the slow path condition of the flow chart of FIG. 5.

DETAILED DESCRIPTION OF THE DRAWINGS

Figure 1:
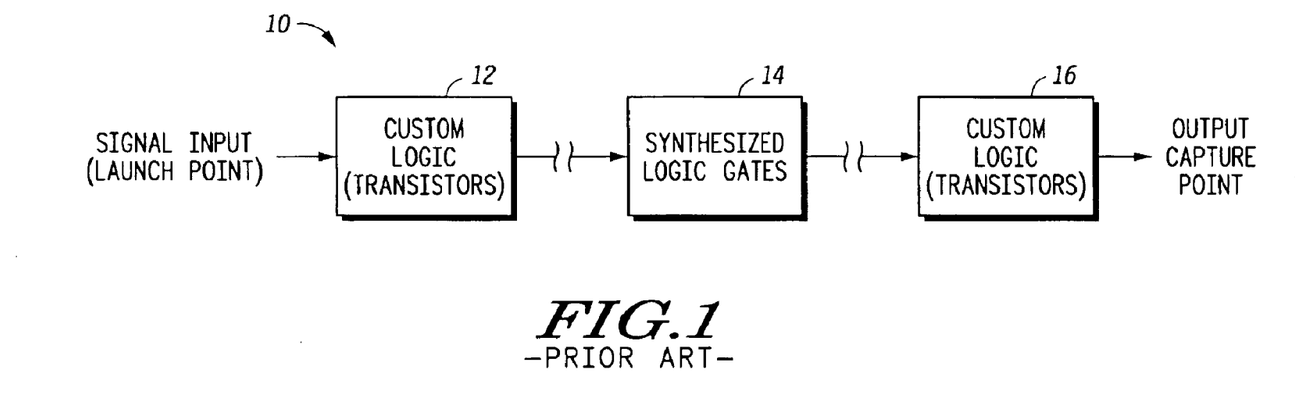

Illustrated in FIG. 1 is an integrated circuit portion 10 of a circuit design having a signal point represented as a launch point connected to an input of a block of custom logic 12. Custom logic 12 is formed of a plurality of transistors. An output of custom logic 12 is connected to an input of synthesized logic gates block 14. An output of synthesized logic gate block 14 is coupled to an input of custom logic block 16 which is formed of a plurality of transistors. Intervening circuitry may or may not be present between synthesized logic gates block 14 and custom logic block 16 as indicated by the broken line. An output of custom logic block 16 provides an output capture point.

In operation, integrated circuit portion 10 illustrates a path corresponding to a circuit design in an integrated circuit in which a signal transition at the launch point results in an output transition at the output capture point. The timing analysis tool will identify such paths in the design and will estimate the delay from when the transition occurs at the launch point and when it will appear at the output capture point. The purpose of timing analysis is to make sure that the delay of all the paths in the design fall below a certain timing budget which determines the speed of the circuit. If one of these paths exceeds the budget, then the designer will have to try and reduce the delay along that path in order to meet the timing budget. In a typical design, as illustrated in FIG. 1, the paths may go through various different types of blocks. Some of these blocks might be designed at the transistor level in a custom design fashion or they could be synthesized blocks at the gate level. Hence, the tool that needs to do timing analysis and optimization has to be able to deal with the different types of logic encountered, whether they are gates or transistors, and have to deal with the complexity of these designs.

Figure 2:
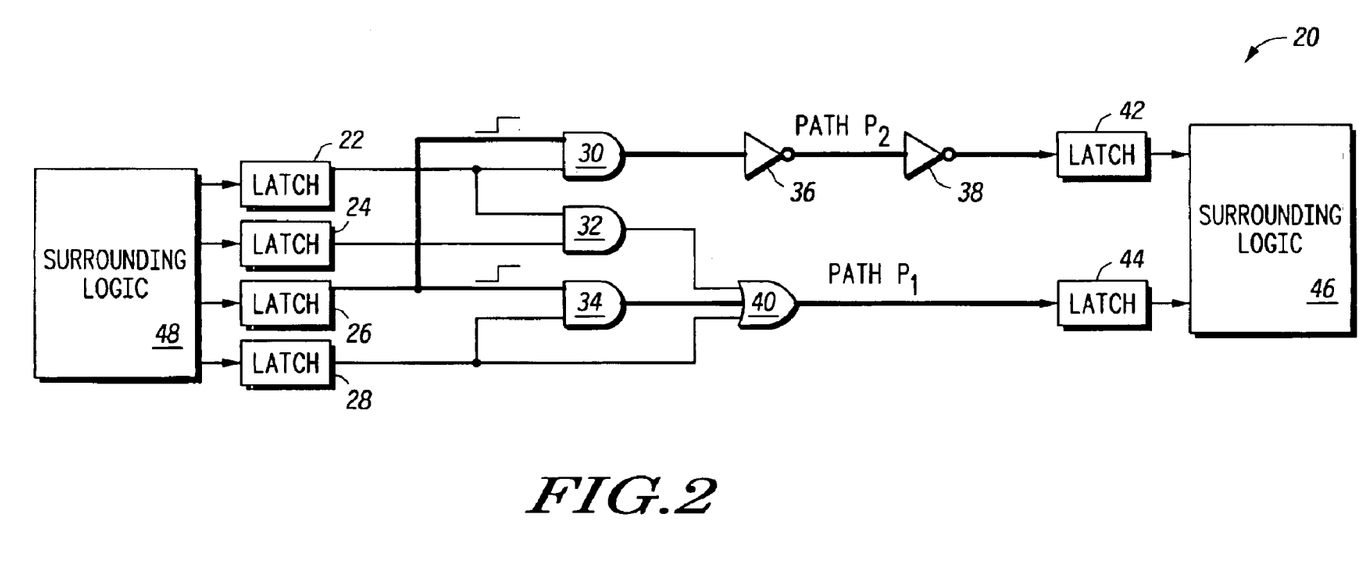

Illustrated in FIG. 2 is an example 20 of a portion of an integrated circuit. The integrated circuit has a plurality of latch circuits 22, 24, 26 and 28. Each of the latch circuits 22, 24, 26 and 28 has an input and an output for data. It should be well understood that the latch circuits described herein have both clock and data inputs. An output of latch circuit 22 is connected to a first input of an AND gate 30 and to a first input of an AND gate 32. An output of latch circuit 24 is connected to a second input of an AND gate 32, and an output of latch circuit 26 is connected to a first input of an AND gate 34. An output of latch circuit 28 is connected to a second input of AND gate 34. The output of latch circuit 26 is also connected to a second input of AND gate 30. The output of AND gate 30 is connected to an input of an inverter 36. The output of AND gate 32 is connected to a first input of an OR gate 40. The output of AND gate 34 is connected to a second input of OR gate 40 and the output of latch circuit 28 is connected to a third input of OR gate 40. The output of inverter 36 is connected to an input of inverter 38 having an output connected to an input of a latch circuit 42. The output of OR gate 40 is connected to an input of a latch circuit 44. Latch circuits 42 and 44 each have an output connected to surrounding logic 46. The inputs of latch circuits 22, 24, 26 and 28 are connected to surrounding logic 48.

The paths contained within the block can be false due to local constraints of the blocks themselves or due to external environmental constraints imposed by the surrounding logic. For example, the path that starts at latch circuit 26 going into AND gate 34 on through OR gate 40 and going out to latch element 44 is a false path because, in order to activate this path, the second input to AND gate 34 will have to be at the value 1 and the side input of the OR gate 40 will have to be at the value 0. This signal condition is impossible because both signals are driven from the output of latch circuit 28 as shown in FIG. 2. As a result, the Path P1 is false. The second path P2 in FIG. 2 that starts with latch circuit 26 and continues through AND gate 30, inverter 36, inverter 38 and ends with a capture point at the data input of latch circuit 42 is a true path satisfying the combinational constraints of that block. However, because of external sequential constraints that path can be false as well. For example, assume the two values at the inputs of latch circuits 22 and 26 are respectively constrained by the surrounding logic to be one-hot. The constraint "one-hot" means that only one of these two signals can be logic one at any given time. Hence the two signals cannot both be one at the same time. Assume that a high-to-low logic transition occurs at the first input of AND gate 30. The one-hot external constraint results in the output of AND gate 30 always being a low logic value. However, due to various factors which can modify when the signal edge transitions at the inputs of AND gate 30, the output of AND gate 30 may possibly assume a logic one value should both inputs momentarily in the second time frame become a logic one as a result of such factors. Therefore, for a high-to-low signal transition at the output of latch 26, the final value condition and the side value condition are both satisfied for path P2. But when a low-to-high logic transition is present at the output of latch 26, the final value condition of the timing path going through AND gate 30 is violated because during the second time frame the second input of AND gate 30 is a controlling value (0) due to the one-hot constraint. This is an example of an external constraint from the surrounding logic that will make the path false. The following discussion is restricted to an analysis of local constraints imposed by the combinational blocks that contain the path and will not consider external constraints.

Figure 3:
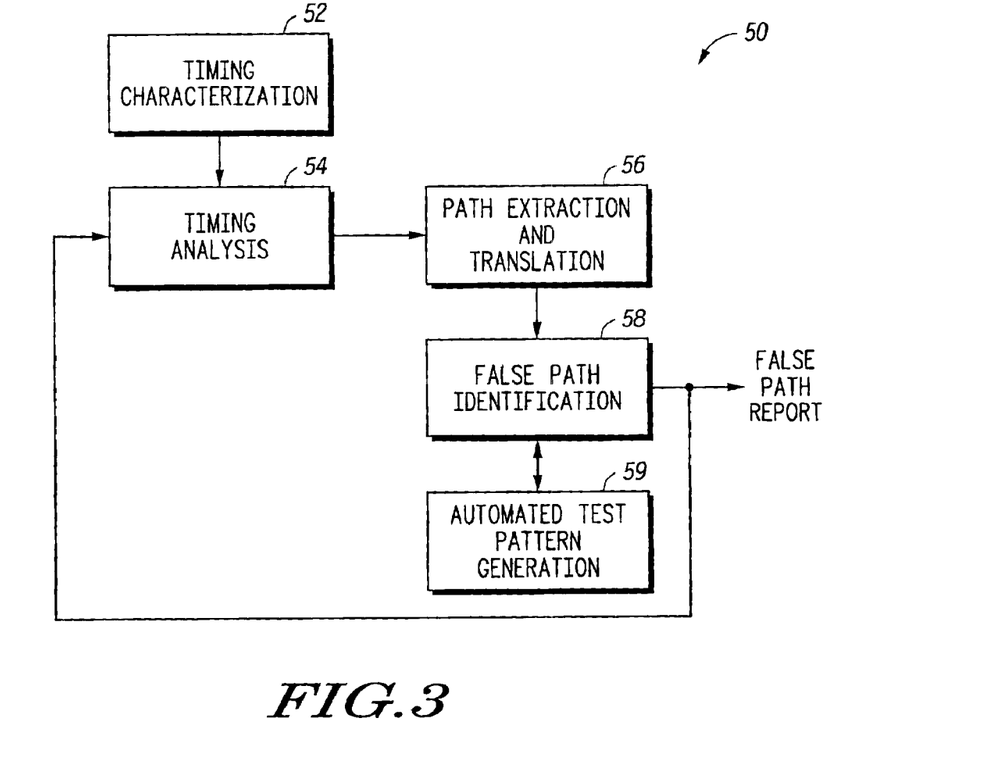

Illustrated in FIG. 3 is a process flow 50 for performing timing analysis, path extraction, path translation and false path identification. A timing characterization step 52 is initially performed on all the building blocks of the integrated circuit. It should be understood that the term "building blocks" encompasses both library cells and custom designed blocks. The output of the timing characterization is provided to a timing analyzer for a timing analysis step 54. The timing analysis step 54 may be performed by any one of a variety of commercially existing or customized timing analysis tools. Information from the timing analysis step 54 is provided to a path extraction and translation step 56. Upon performing path extraction, which will be described below, an output of step 56 is provided in the form of a false path identification step 58. After false paths are identified, if any, a false path report is provided as an output of step 58. The false path report is provided back to the timing analysis tool and can be used in consecutive timing analysis step 54. Intermediate results from the false path identification step 58 are provided to an automated test pattern generation (ATPG) tool to check the satisfiability of logic values of nodes in the path or paths under consideration. The ATPG tool uses the intermediate results from false path identification step 58 and provides circuit and path information that is used to generate the false path report. ATPGs are well known in the art and are commercially available for performing specific test pattern generation on integrated circuits in an automated fashion to test their functionality. In general, ATPG tools perform a justifiability analysis by determining whether certain conditions can be satisfied or not. For example, ATPG tools may assign logic values to internal nets (circuit nodes) and analyze whether certain input value assignments can satisfy the assigned values. The justifiability function of ATPG tools may be implemented by various algorithms, including but not limited to the standard backtracking algorithm.

It should be noted that the process used between steps 58 and 59 is bidirectional. The bi-directionality indicates that the false path identification process utilizes specific information from the ATPG and frequently calls for information or results created by the ATPG in order to perform the false path identification. Details of the interaction between the false path identification step 58 and an ATPG will be provided below.

Figure 4:
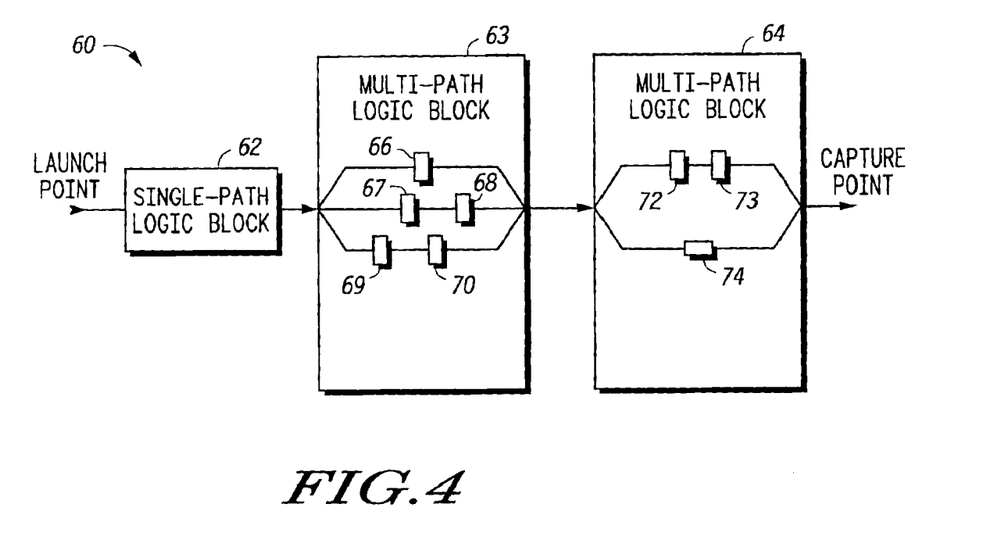

Illustrated in FIG. 4 is a detail of the path extraction and translation step 56 of FIG. 3. FIG. 4 is an example of a complex path 60 that is identified by the timing analysis step 54. The complex path is identified as starting with a launch point having an input to a single path logic block 62. An output of single path logic block 62 is connected to an input of a multiple-path component logic block 63. An output of multiple-path component logic block 63 is connected to an input of a multiple-path component logic block 64. An output of the multiple-path component logic block 64 provides a capture point for the complex path. The timing analysis of step 54 in FIG. 3 recognized only the inputs and outputs of single path component logic block 62 and multiple-path component logic blocks 63 and 64. In the illustrated form, multiple-path component logic block 63 comprises a plurality of component paths in the form of three separate paths. A first path is connected to the input of multiple-path component logic block 63 and contains single path component logic block 66. A second path of multiple-path component logic block 63 contains a single path component logic block 67 and a single path component logic block 68. Yet a third path of multiple-path component logic block 63 contains a single path component logic block 69 and a single path component logic block 70. In the illustrated form, multiple-path component logic block 64 has two paths. A first path contains a single path component logic block 72 and a single path component logic block 73. A second path of multiple-path component logic block 64 contains a single path component logic block 74. As described herein, the single-path components and multiple-path components are formed using conventional combinational logic elements. In this example, the timing analysis tool identifies the complex path going through blocks 62, 63 and 64 as a single component timing path. However, in order to determine whether this path is a true path or a false path, we have to first translate this path from the timing domain format into a format where it can be analyzed using commands from the ATPG tool. The format of paths extracted by the timing analysis tool is very different from the format of paths that can be analyzed using ATPG. In order to bridge this gap, we developed a translation process to map the net names, the hierarchical nets and port names from the domain of timing analysis to the domain of ATPG tools before performing false path identification. We also have to enumerate all the subpaths within block 63 and 64 and identify all the possible paths going through these two blocks and analyze the falseness of all these individual subpaths. If all the subpaths are found to be false, then path 60 is false. If one of the subpaths is found to be true, then path 60 can be a true path.

Figure 5:
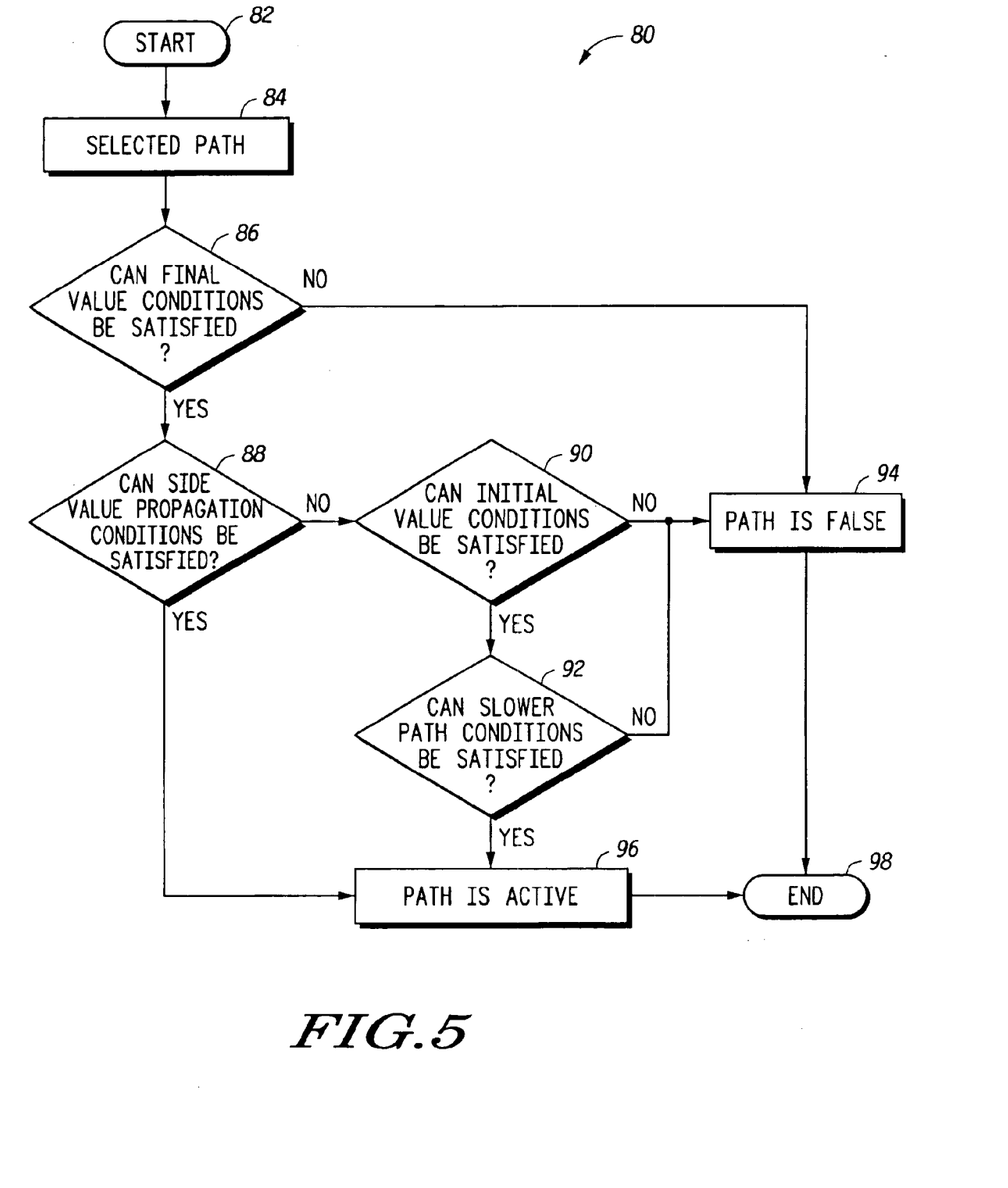

Illustrated in FIG. 5, in flow chart form, is a process 80 for false path identification. A start step 82 transitions to receiving a selected path in step 84. The selected path is the result of the timing analysis step 54 and path extraction and translation step 56 of FIG. 3. Path P is characterized by the set of nodes along the path. Each one of these nodes will assume a certain transition that will require going from a previous value or initial value to a final value. In the next step of the process, we examine condition 86. The condition is a determination as to whether a set of final value conditions along all the nodes of the path can be satisfied within the combinational block or not. The answer to this question is determined by the ATPG tool that analyzes the constraints of the circuit and whether the final value conditions can be met or not. If the answer is no, then the path is declared false and we exit this process at end step 98. Otherwise, if the answer is found to be "yes," meaning all the final values of the signals can be satisfied simultaneously, then we go into step 88. In step 88, we determine or evaluate whether a set of side value propagation conditions are satisfied. That condition states that all the side inputs of all the gates along the path have to assume non-controlling values. A non-controlling value for AND gates and NAND gates is 1. A non-controlling value for OR gates and NOR gates is 0. A non-controlling value for XOR gates can be either 0 or 1. Step 88 calls the ATPG tool to check whether these side-value propagation conditions can be satisfied by the circuit or not. If that is found to be true, then the path is determined to be an active path and we exit again at step 98. If it is false, then we proceed to step 90. In step 90, the ATPG is called to check whether a set of initial value conditions of all the nodes along the paths is satisfied. If that is true, then we continue to step 92 where we determine whether a set of slower path conditions are satisfied. If so, the path is then characterized as being active in step 96. An active characterization means that the path could be true, but it could also be false for other reasons not being analyzed. Therefore, the term "active" is used rather than "true" or "false". If the result of step 92 is negative, then we determine that the path must be false in step 94 and we again exit at step 98. If the initial value condition is true, we go to step 92 where we check for whether there are slower path conditions and whether any slower path conditions can be satisfied or not. A slower path condition requires that a slower path must exist at each side input where the side input propagation condition is violated. This condition will be explained below in FIG. 7. If the condition of step 92 is found to be false, then the path is also determined to be false and we exit. Otherwise, if the condition is true, the path is determined to be an active path and we also exit. That terminates the process 80 for false path identification.

Figure 6:
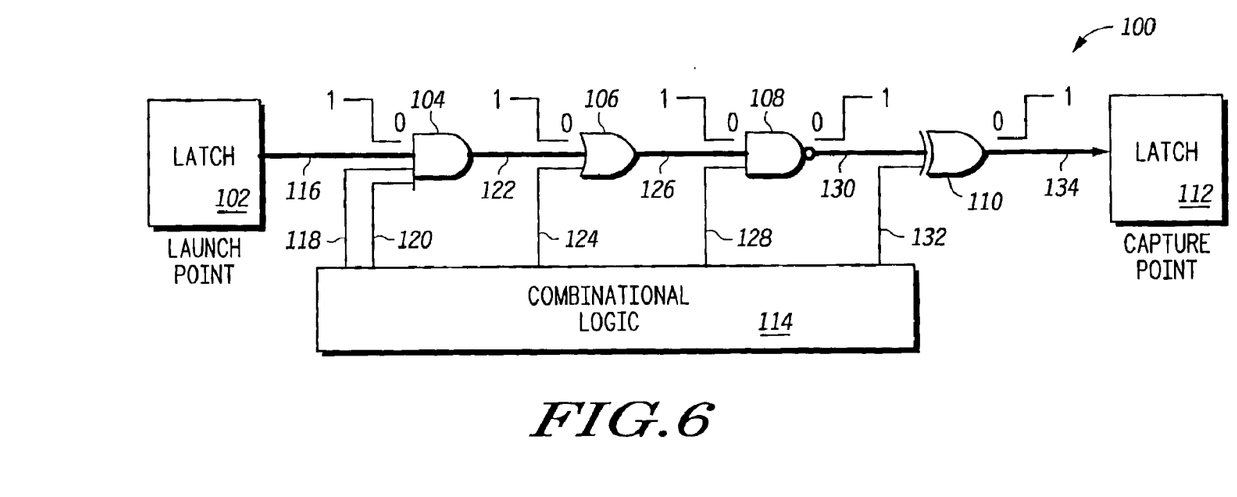

Illustrated in FIG. 6 is an example path 100 to further the understanding of the process 80 of FIG. 5. In example path 100, a latch 102 stores a digital value for the launch point. An output of latch 102 is connected to a first input of an AND gate 104. A second input 118 of AND gate 104 is provided by combinational logic 114. A third input 120 of AND gate 104 is also provided by combinational logic 114. An output of AND gate 104 is connected to a first input of OR gate 106. Combinational logic 114 provides a second input 124 to OR gate 106. An output of OR gate 106 is connected to a first input of NAND gate 108. Combinational logic 114 provides a second input 128 to NAND gate 108. An output of NAND gate 108 is connected to a first input of exclusive OR (XOR) gate 110. Combinational logic 114 provides a second input 132 to XOR gate 110. An output 134 of XOR gate 110 is connected to a latch 112 that captures the digital value of the signal path example 100. Also illustrated in FIG. 6 is a sample signal transition from a digital 1 value to a digital 0 value at the output of latch 102. The transition occurs after a first time period or time frame and transitions to a logic 0 value during a second time period or time frame. The transition at the input of AND gate 104 is propagated through AND gate 104, OR gate 106, NAND gate 108 and XOR gate 110. The same signal transition occurs at the output of AND gate 104, OR gate 106 but changes at the output of NAND gate 108 and XOR gate 110 as will be described below. Reference now should be made back to FIG. 5 for an explanation of each of the calculations involved in the steps 86, 88 and 90. The path in FIG. 6 goes through gates 104, 106, 108 and 110. The set of the final value condition for the path consist of the following condition: having a 0 on input 116, a 0 on input 122, a 0 on input 126, a 1 on input 130, and a 1 on input 134. These five signal conditions together define the final value condition for the path. This is the condition that will be checked during step 86 in FIG. 5. In step 88, the side value propagation condition will be checked. The side value condition has the following: signal 118 at value 1, signal 120 at value 1, signal 124 at value 0, signal 128 at value 1, and signal 132 at value 0. Note here that since the signal transition at the input of XOR gate 110 is the same as the signal transition at its output, the side input value is required to be at value 0. These five signal conditions on the side inputs that need to be satisfied are checked in step 88 in conjunction with the previous conditions that were specified in step 86. So both sets of conditions have to be satisfied simultaneously for step 88 to produce a "yes" answer. In step 90, we check the initial value condition. That check is performed in a second time frame different from a first time frame during which steps 86 and 88 are performed. The initial value condition for the path in FIG. 6 has the following: a 1 on signal 116, a 1 on signal 122, a 1 on signal 126, a 0 on 130, and a 0 on signal 134. These five values have to be simultaneously satisfied.

Figure 7:
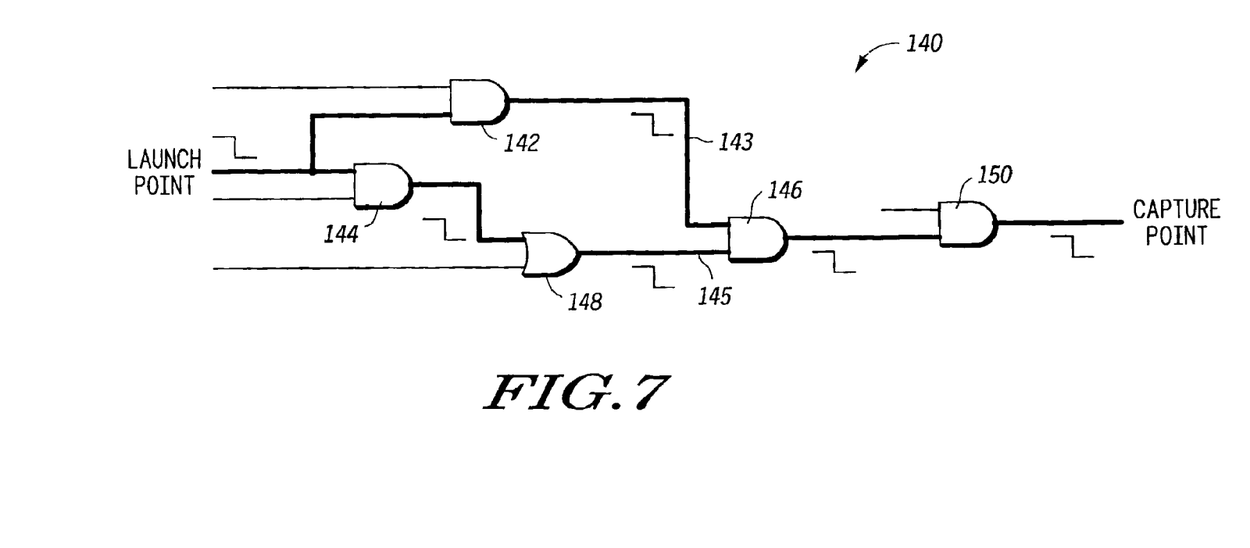

Illustrated in FIG. 7 is an example path 140 which will illustrate the slower path conditions being satisfied step 92 of FIG. 5. In the illustrated form, a launch occurs at a first input of an AND gate 142 and an AND gate 144. The first input of AND gate 142 receives a digital signal transitioning from a 1 to a 0. An output of AND gate 142 is provided via conductor 143 to a first input of AND gate 146. A second input of AND gate 144 is provided as a side input. An output of AND gate of 144 is connected to a first input of an OR gate 148. A second input of OR gate 148 is provided as a side input. An output of OR gate 148 is connected via a conductor 145 to a second input of AND gate 146. An output of AND gate 146 is connected to a first input of AND gate 150. A second input of AND gate 150 is provided as a side input. An output of AND gate 150 provides a capture signal for the path 140.

In the illustrated form, a digital transition occurs from a logic 1 value to a logic 0 value at the first input of AND gate 144. This digital transition causes the output of AND gates 142 and 144 to both go to a logic 0 value. The output of OR gate 148 concurrently goes from a logic 1 to a logic 0 as does the output of AND gate 146 and 150. In this example, there are two paths that are being activated simultaneously. Let us assume that we are trying to identify the status of the top path going through gate 142, gate 146 and gate 150. In order for that path to be activated, the side inputs have to be assigned to non-controlling values. Hence, the side input to AND gate 146, conductor 145, has to be at value 1 for the path to be active. However, as indicated, conductor 145 will be transitioning from 1 to 0. Hence, the side value condition is not satisfied for that side input. However, if the 1-to-0 transition along conductor 145 is slower to arrive at gate 146 than the transition on conductor 143, then the path in question is still a valid path. Hence, the slower path condition is defined as follows: if a slower path exists which converges at each side input where the side value propagation condition is violated, then the path being analyzed can still be considered active. In that particular example, in FIG. 7, the top path going through AND gate 142, AND gate 146 and AND gate 150 is an active path assuming that the side input transition along conductor 145 is slower to arrive than the one arriving at conductor 143. On the other hand, consider the second path going through AND gate 144, OR gate 148, AND gate 146 and AND gate 150. In that case, the side value condition will also be violated at the input of the AND gate 146. However, in that case, the slow value condition will not be satisfied since, obviously, the arrival of the transition on conductor 143 is faster than the arrival of the transition of the signal on conductor 145. The slow path condition is determined by examining the ordered list of paths produced by the timing analyzer.

By now it should be appreciated that there has been provided a design analysis tool and method of use for false timing path identification for industrial circuits, both on the integrated circuit (IC) scale as well as a board level. Both static and dynamic path sensitization criteria are taken into consideration during the false path identification process of FIG. 5. The false path identification process of FIG. 5 is static in the sense that both final values and initial values are checked to see if they can be satisfied. However, the criteria are dynamic in the checking for slower path conditions to be satisfied. The process of FIG. 7 illustrates how dynamic the test is in connection with determining whether delay affects on a particular path affect the delay of the circuit in general. It should be noted that commercially available ATPG software may be used to practice the present invention without any modification of the ATPG tool itself. ATPG techniques are utilized to identify conflicts of logic assignments within a large complex design very rapidly. As a result, the present invention is also extremely fast and effective. No circuit modification or special purpose ATPG is required. The present invention works for all types of designs as there is no restriction on whether the design is synthesized or custom, large or small. Engineering resources are preserved by minimizing wasteful efforts spent on optimizing false timing paths as a result of the present invention. The present invention eliminates the creation of unnecessary circuit area, the dissipation of additional power, and reduction in performance which is typically associated with the optimization of false paths. The present invention utilizes a translation function to enable the timing analysis tool and the ATPG tool to be utilized for path delay testing in a way in which previously neither tool was effectively utilized in combination.

It should be appreciated that the process flow of FIG. 5 may be modified by those of ordinary skill in the testing and timing analysis art. Steps 86 and 88 are provided sequentially for optimization of the process. In particular, it should be noted that the information needed to perform each determination exists in the same time frame. In particular, by referring to FIG. 6, it may be noted that the checking of a set of final value conditions and a set of side value conditions at the input of AND gate 104 when it transitions from a logic 1 to a logic 0 value involves steps 86 and 88. By taking each of steps 86 and 88 sequentially, they can optimize the use and presence of the value during the same time. In contrast, step 90 requires a different time frame as the initial logic value of 1 exists previous to the value for steps 86 and 88. In one form, to implement step 90, a reset of the relevant circuitry under test may be implemented so that the initial value condition is a known condition. In this case the known condition was a logic 1 value in FIG. 6. That being said, the process of FIG. 5 may be altered so that step 90 could be performed previous to step 86 and 88. In such an event, the same criteria and process would be utilized to determine whether or not a path is false or active. It should also be appreciated that steps 86 and 88 may be reversed in order or that steps 86 and 88 may be combined. However, it should be noted that additional steps may be required if modifications of FIG. 5 are implemented.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises", "comprising" or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for identifying false paths, comprising:
providing a path corresponding to a circuit design;
determining whether a set of final value conditions are satisfied;

determining whether a set of side value propagation conditions are satisfied;

determining whether a set of initial value conditions are satisfied;

determining whether one or more slower path conditions are satisfied; and determining whether the path is false based on whether the set of final value conditions, the set of side value propagation conditions, the set of initial value conditions and the one or more slower path conditions are satisfied.

2. The method of claim 1, wherein the set of final value conditions and the set of side value propagation conditions correspond to a first time frame and the set of initial value conditions corresponds to a second time frame, different from the first time frame.

3. The method of claim 1, wherein at least one of determining whether a set of final value conditions are satisfied, determining whether a set of side value propagation conditions are satisfied, and determining whether a set of initial value conditions are satisfied, is performed by an automatic test pattern generation (ATPG) tool.

4. A method for identifying false paths, comprising:

providing a first set of paths corresponding to the circuit design, the first set of paths having single-path component logic blocks and multiple-path component logic blocks;

extracting a second set of paths from the first set of paths, the second set of paths having no multiple-path component logic blocks;

providing a path corresponding to a circuit design by selecting the path from the second set of paths;

determining during a first time frame whether a set of final value conditions are satisfied;

determining during the first time frame whether a set of side value propagation conditions are satisfied;

determining during a second time frame different from the first time frame whether a set of initial value conditions are satisfied; and determining whether the path is false based on at least one of the set of final value conditions, the set of side value propagation conditions, and the set of initial value conditions.

5. A method for false path identification within a circuit design, comprising:

receiving a first set of paths corresponding to the circuit design;

generating timing analysis information associated with the first set of paths;

selecting at least one path of the first set of paths;

providing a set of conditions corresponding to the at least one path of the first set of paths to an automatic test pattern generation (ATPG) tool, the set of conditions comprising whether a final value condition is satisfied, whether one or more side value propagation conditions are satisfied and whether an initial value condition is satisfied;

using the timing analysis information to determine whether one or more slower path conditions are satisfied;

the ATPG tool generating a response to the set of conditions; and identifying a false path within the first set of paths based on the response from the ATPG tool and the timing analysis information.

6. The method of claim 5, further comprising after receiving the first set of paths, translating the first set of paths from a first format to a second format.

7. The method of claim 5, further comprising:

after receiving the first set of paths, extracting a second set of paths from the first set of paths, wherein the set of conditions corresponds to at least one path of the second set of paths.

8. The method of claim 5, wherein the response to the set of conditions from the ATPG tool indicates whether the set of conditions is satisfied.

9. The method of claim 5, wherein the ATPG tool is a commercially available ATPG tool.

10. The method of claim 5, wherein receiving the first set of paths comprises receiving the first set of paths from a timing analysis tool.

11. A method for false path identification within a circuit design, comprising:

receiving a first set of paths corresponding to the circuit design from a timing analysis tool;

providing a set of conditions corresponding to at least one path of the first set of paths to an automatic test pattern generation (ATPG) tool, the set of conditions comprising determining whether an initial value condition and a final value condition are satisfied;

the ATPG tool generating a response to the set of conditions; and identifying a false path within the first set of paths based on the response from the ATPG tool and whether the one or more slower path conditions are satisfied, wherein a false path report of the false path is fed back to the timing analysis tool.

12. A method for identifying false paths comprising:

determining a first set of paths corresponding to a circuit design, the first set of paths having single-path component logic blocks and multiple-path component logic blocks;

extracting a second set of paths from the first set of paths, the second set of paths having no multiple-path component logic blocks;

selecting a path from the second set of paths;

determining whether a set of final value conditions are satisfied;

determining whether a set of side value propagation conditions are satisfied;

determining whether a set of initial value conditions are satisfied; and determining whether the path is false based on the set of final value conditions, the set of side value propagation conditions, and the set of initial value conditions.

13. The method of claim 12, further comprising:

determining whether a set of slower path conditions are satisfied, and determining whether the path is false based on all of the set of final value conditions, the set of side value propagation conditions, the set of initial value conditions, and the set of slower path conditions.

14. A method for identifying false paths within a circuit design with an automatic test pattern generation (ATPG) tool, comprising:

receiving a first set of paths corresponding to the circuit design from a timing analysis tool;

providing a plurality of sets of conditions corresponding to at least one path of the first set of paths to the ATPG tool, the plurality of sets of conditions comprising a set of final value conditions, a set of side value propagation conditions and a set of initial value conditions;

using the ATPG tool to determine whether the set of final value conditions is satisfied;

using the ATPG tool to determine whether the set of side value propagation conditions is satisfied;

using the ATPG tool to determine whether the set of initial value conditions is satisfied;

using information from the timing analysis tool to determine whether a set of slower path conditions is satisfied;

receiving a response from the ATPG tool; and identifying a false path within the first set of paths based on the response from the ATPG tool and the information from the timing analysis tool.

15. The method of claim 14, further comprising translating the first set of paths received from the timing analysis tool from a first format to a second format that can be analyzed by the ATPG tool.

16. The method of claim 14, further comprising:

extracting a second set of paths from the first set of paths, wherein the plurality of sets of conditions corresponds to at least one path of the second set of paths.

17. The method of claim 14, wherein the response to the plurality of sets of conditions from the ATPG tool indicates whether the set of conditions is satisfied.

18. The method of claim 14, further comprising providing a false path report to the timing analysis tool.

19. The method of claim 14, wherein the ATPG tool is a commercially available ATPG tool.

20. The method of claim 14, wherein timing characterization of circuitry containing the first set of paths is provided to the timing analysis tool.

* * * * *